Nov. 29, 1966
IZUO HAYASHI
VARIABLE FREQUENCY PHASE SHIFT OSCILLATOR
UTILIZING FIELD-EFFECT TRANSISTORS
Filed April 29, 1965
3,289,102
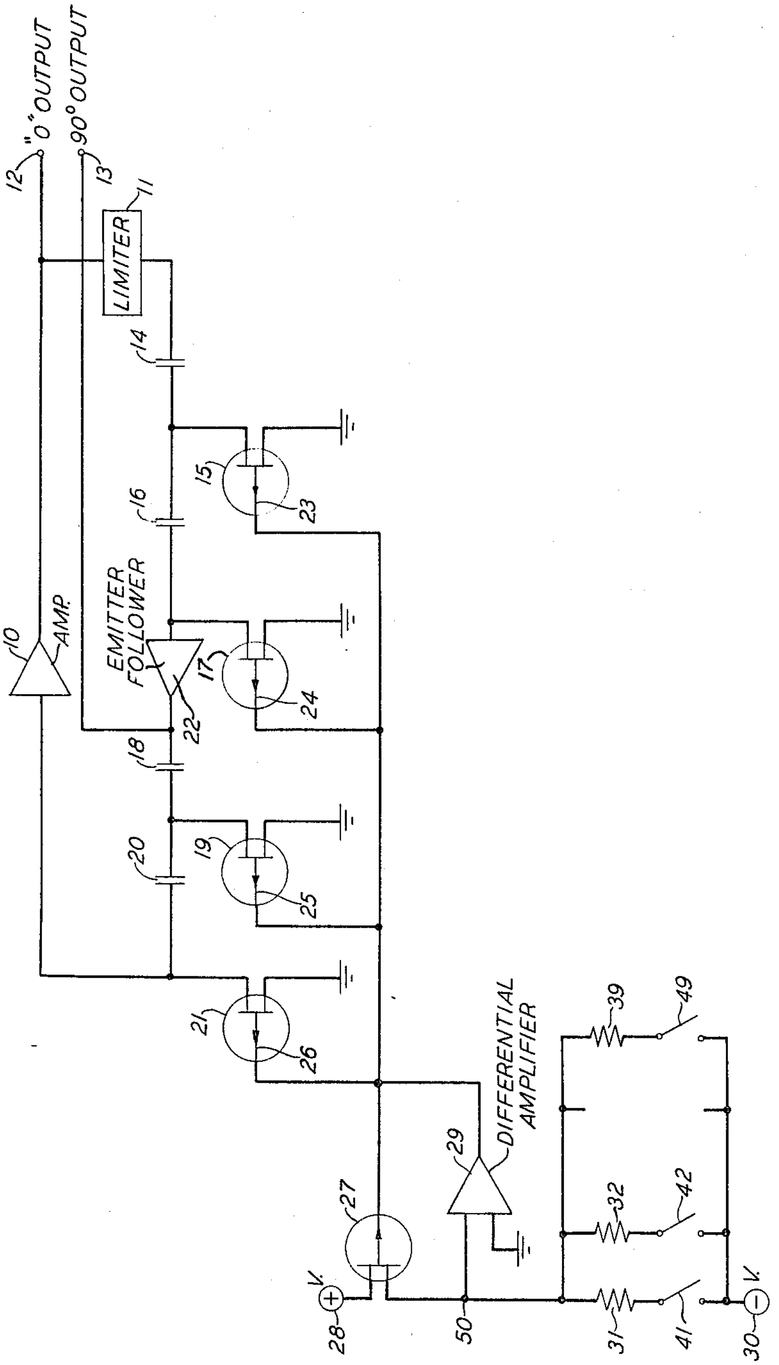
INVENTOR
I. HAYASHI
BY
R.O. Nimz
ATTORNEY United States Patent Office 3,289,102

Patented Nov. 29, 1966

3,289,102

VARIABLE FREQUENCY PHASE SHIFT OSCILLATOR UTILIZING FIELD-EFFECT TRANSISTORS

Izuo Hayashi, Fanwood, N.J., assignor to Bell Telephone Laboratories, Incorporated, New York, N.Y., a corporation of New York Filed Apr. 29, 1965, Ser. No. 451,706

10 Claims. (Cl. 331—109)

This invention relates to oscillators and more particularly to oscillators using field-effect transistors as the frequency determining elements.

In diversity receivers, it is necessary for demodulation for the local oscillator signals to be of identical frequency but separated from each other by a predetermined number of degrees of phase shift. A practical way of supplying the multiphase signals is through the use of a phase shift type oscillator wherein the required feedback for oscillation is provided by several resistance-capacitance type phase shifting networks connected in series. If the oscillator is to have a variable frequency and the equipment must also be miniaturized, it is especially desirable to utilize field-effect transistors as the resistance elements in the phase shifting network. Changing the value of the potential on the gate electrodes results in a change in the value of resistance presented by the transistors and a corresponding change in the frequency at which the amount of phase shift necessary for oscillation occurs. Unfortunately, the value of impedance presented by a field-effect transistor is also dependent on ambient conditions such as temperature. Consequently, a constant gate voltage would not necessarily result in a constant output frequency.

It is therefore one object of the present invention to provide an oscillator utilizing field-effect transistors as the frequency determining elements and which are less sensitive to ambient temperature.

Another object of the present invention is to provide an oscillator with at least two outputs separated from each other by a predetermined number of degrees of phase shift.

Still another object of the present invention is to provide a phase shift oscillator whose frequency is changed by changing the value of a single component, thereby facilitating remote operation of the oscillator.

These and other objects are obtained in accordance with the present invention wherein a variable frequency oscillator utilizes a phase shifting network made up of fixed capacitors and field-effect transistors as variable resistors. An emitter follower divides the phase shifting network at a midpoint in order to provide a second output shifted in phase by 90 degrees from the normal output. The bias on the gates of the field-effect transistors is provided by the output of a differential amplifier which is also connected to the gate of a matched field-effect control transistor external to the network. The other electrodes of the control transistors are connected in a voltage divider network at the input of the amplifier with a resistor of changeable value such that the gate voltage on all transistors is set by the amplifier at a value for which the impedance of the control transistor equals the selected value of the resistor. As a result, the oscillating frequency is determined by selecting the value for a single resistor, and the effects of ambient temperature changes on the frequency of oscillations are substantially eliminated.

The objects and advantages of the invention will be more clearly understood from a consideration of the following specification in connection with the attached drawing in which the single figure thereof is a schematic diagram of a preferred embodiment of the invention.

In the figure, symbol 10 is used to designate an amplifier having an odd multiple of 180 degrees phase shift and sufficient amplification over the frequency range of interest so as to sustain oscillations when used in combination with the feedback network to be described hereinbelow. It is advantageous if the changes in phase shift of amplifier 10 can be made negligible over the frequency range of interest in order that the oscillating frequency be determined entirely by the phase shift presented by the feedback network. The output of amplifier 10 is connected to the first element of the feedback network, limiter 11, and to output terminal 12. Limiter 11 may consist of any of the conventional type amplitude limiting circuits, such as diode limiters, which are utilized in feedback type oscillators to improve the waveshape of the generated signal.

Limiter 11 is connected to capacitor 14 and field-effect transistor 15 which make up the first of four sections of resistance-capacitance high-pass phase shifting networks each one of which consists of a fixed capacitor and a changeable resistance provided by a field-effect transistor. The other three networks are designated by the elements 16–17, 18–19, and 20–21. The frequency at which the entire phase shifting network provides 180 degrees phase shift is the frequency at which the circuit will oscillate. As is well known from elementary network theory, this frequency will be dependent on the value of resistance presented by field-effect transistors 15, 17, 19 and 21, which value is, in turn, dependent on the potential which is applied to the gate electrodes 23 through 26. Although the electrodes other than the gate electrode of a field-effect transistor are generally designated by those skilled in the art as source and drain electrodes, most field-effect transistors have symmetrical characteristics, i.e., the drain and source are indistinguishable. Accordingly, in the instant specification, general reference to an electrode will mean either the source or drain electrode whereas the gate electrode will always be fully designated.

Emitter follower 22 is advantageously inserted between capacitors 16 and 18 in order to provide a terminating impedance to the first half of the phase shifting network, comprising elements 14 through 17, which is substantially equal to the terminating impedance provided by the input of amplifier 10 to the last half of the phase shifting network, comprising elements 18 through 21. As a result, the phase shift provided by elements 14 through 17 is substantially constant at one half of the total 180 degree phase shift provided by the entire phase shifting network. Output terminal 13, connected to the low impedance junction of capacitor 18 and emitter follower 22, therefore provides a signal shifted in phase by 90 degrees from the signal at output terminal 12 throughout the entire frequency range.

Even though limiter 11 advantageously restricts the amplitude of the signals applied to field-effect transistors 15, 17, 19 and 21 so that they are operating within the linear range of their voltage-current characteristics, the impedance presented by the transistors with a constant voltage applied to gate electrodes 23 through 26 will change under ambient temperature conditions. In accordance with the present invention, the voltage applied to gate electrodes 23 through 26 is changed in a way so as to compensate for ambient conditions, thereby maintaining the oscillations at a substantially constant frequency.

Field-effect transistor 27 is selected to have impedance and temperature characteristics matched to those of the field-effect transistors, 15, 17, 19 and 21, used in the phase shifting network. The gate electrode of transistor 27 is connected to the gate electrodes 23 through 26 of the transistors in the network and is also connected to the output of differential amplifier 29. Amplifier 29 may be of the type shown on page 444 in vol. 18 of the M.I.T. Radiation Laboratory Series or a transistorized version thereof. One electrode of transistor 27 is connected to positive potential source 28 and the other electrode is connected to the junction of resistors 31 through 39. Any one or several of the latter resistors are selected by switches 41 through 49 to be connected through to minus potential source 30. The particular value of resistance which is chosen is dependent on the frequency of oscillations desired at outputs 12 and 13. Switches 41 through 49 can be of the manual type, of the electronic type, such as transistor switches, or of the electro-mechanical type such as relays.

One input to differential amplifier 29 is connected to the point 50 at the junction of one electrode of transistor 27 and resistors 31 through 39. For the polarities as shown, with transistor 27 connected to the positive potential source 28, the input of amplifier 29, which is connected to point 50, must be selected from the two inputs to be the one for which an increase in positive potential at point 50 will cause the output of amplifier 29 to change the potential on the gate electrode of transistor 27 to a value at which transistor 27 will present a higher impedance. The other input to amplifier 29 is connected to a reference potential. As will be appreciated by those skilled in the art, this type of negative feedback arrangement will cause amplifier 29 to maintain point 50 at reference potential by changing the voltage applied to the gate electrode of transistor 27 in order to compensate for any impedance changes in transistor 27 due to ambient conditions.

When minus potential source 30 is equal in value to positive potential source 28, the value of impedance presented by transistor 27 will always be equal to the value of resistance inserted in the circuit by operation of switches 41 through 49. Since gate electrodes 23 through 26 are also connected to the output of amplifier 29, and since transistor 27 is selected to have matched characteristics to transistors 15, 17, 19, and 21, the latter transistors will also each present an impedance in the network equal in value to the value of resistance selected by switches 41 through 49. Consequently, the frequency at which the entire phase shifting network will exhibit an odd multiple of 180 degrees, and therefore the frequency of the signals at outputs 12 and 13, is determined solely by the value of resistance inserted in the circuit by operation of switches 41 through 49. This resistance can be made much less sensitive to ambient conditions than the field-effect transistors themselves. Moreover, this circuit arrangement is much less complicated from the standpoint of remote operation of the circuit than having changeable resistors in place of each of the transistors 15, 17, 19, and 21.

Although the invention has been described and illustrated in connection with a specific circuit, many changes can be made in the circuit by those skilled in the art and still remain within the spirit and scope of the invention. For example, the polarity of the potential sources 28 and 30 may be interchanged along with an interchange of the input connections to amplifier 29 and the circuit operation would remain unchanged. A single variable resistance may be substituted for resistors 31 through 39 and switches 41 through 49 resulting in an oscillator having a continuous frequency range. Similarly, a single resistance substituted for resistors 31 through 39 may have a fixed value, and the frequency may be changed by changing the voltage from minus potential source 30. While field-effect transistors are particularly suitable due to their large dynamic impedance range, other voltage-controlled impedance elements could also be used.

Accordingly, it is to be understood that the above-described circuit is illustrative of the application of the principles of the present invention and numerous modifications thereof may be devised by those skilled in the art without departing from the spirit and scope of the invention.

What is claimed is:

1. A variable frequency phase shift oscillator wherein at least one field-effect transistor having a gate electrode is used to present a variable resistance with respect to a reference potential, means for developing a direct-current potential for said gate electrode comprising a source of direct-current potential having positive and negative values with respect to said reference potential, resistor means having a changeable value, a control field-effect transistor having matched characteristics to the at least one field-effect transistor in said oscillator and having its source and drain electrodes connected in series with said resistor means across said potential source, a differential amplifier having two inputs and one output, one input being connected to the junction of said control transistor and said resistor means, the other input being connected to said reference potential, and means connecting the output of said amplifier to the gate electrode of said control transistor and to the gate electrode of the field-effect transistor in said oscillator.

2. The oscillator as defined in claim 1 wherein said control transistor has one of its electrodes connected to the positive terminal of said potential source, and said one input of said amplifier is chosen so that a positive potential at said junction causes the resistance of said control transistor to increase.

3. The oscillator as defined in claim 2 wherein said resistor means includes several subcircuits connected in parallel, each subcircuit comprising a resistor and a switch in series.

4. A variable frequency phase shift type oscillator including, in combination, amplifier means having an input and output, feedback network means including several high-pass resistance-capacitance type networks wherein the resistance is a field-effect transistor having a gate electrode; means for supplying a changeable direct-current potential to the gate electrode of each field-effect transistor comprising a control field-effect transistor having temperature and resistance characteristics matched to those of the field-effect transistors utilized in said feedback network means, a source of direct-current potential, a resistance means connected in series with the source and drain electrodes of said control transistor across said source of potential, differential amplifier means having two inputs and an output, means connecting one of said two inputs to the junction of said control transistor and said resistance means, means connecting the other of said two inputs to a reference potential, and means connecting the output of said differential amplifier means to the gate electrode of said control transistor and to the gate electrodes of each field-effect transistor utilized in said feedback network means.

5. An oscillator as defined in claim 4 wherein said feedback network means includes an even number of resistance-capacitance type networks, and an emitter follower means having an input impedance substantially equal to the input impedance of said amplifier means is connected so as to equally divide said resistance-capacitance type networks.

6. An oscillator as defined in claim 5 wherein the feedback network means includes amplitude limiter means connected between the output of said amplifier means and the first of said resistance-capacitance type networks.

7. In a network wherein at least one active device having a control electrode is utilized as a variable resistance to ground, means for supplying a potential to said control electrode of said active device comprising a second active device having a control electrode and temperature and resistance characteristics matched to those of said one active device, a source of direct-current potential having a positive and negative terminals with respect to ground, resistance means of changeable value connected in series with said second active device across said positive and negative terminals, a differential amplifier having an output and two inputs one of which is connected to the junction of said second active device and said resistance means and the other of which is connected to ground, means connecting the output of said differential amplifier to the control electrode of said second active device, and means connecting the control electrodes of said one and said second active devices.

8. In a network as defined in claim 7 wherein the active device is a field-effect transistor.

9. In a circuit wherein the impedance value of at least one voltage-controlled variable impedance element is determined by a passive impedance element having a changeable value, a second voltage-controlled variable impedance element, means connecting said second variable impedance element in series with said passive impedance element across a voltage supply negative feedback, means responsive to potential changes at the junction of said second variable impedance element and said passive impedance element for providing a control voltage to said second variable impedance element which maintains the impedance of said second variable element in a fixed ratio to said passive impedance element, and means for applying said control voltage to said at least one voltage-controlled variable impedance element.

10. In a variable impedance circuit having a plurality of signal-controlled variable impedance elements, means for stabilizing said variable impedance elements against variations in ambient conditions comprising a standard variable impedance relatively insensitive to said ambient conditions, circuit means for detecting the difference in impedance between said standard variable impedance and one of said signal-controlled variable impedances and for generating a signal to be applied to all of said signal-controlled variable impedances so as to reduce said difference.

No references cited.

ROY LAKE, *Primary Examiner.*

J. KOMINSKI, *Assistant Examiner.*